(12) United States Patent
Brandt et al.

(10) Patent No.: US 12,740,011 B2
(45) Date of Patent: Sep. 15, 2026

(54) ELECTRONIC ASSEMBLY WITH A GASKET FOR VENTING MOISTURE

(71) Applicant: Deere & Company, Moline, IL (US)

(72) Inventors: Patrick R. Brandt, West Fargo, ND (US); Daniel P. Lipp, Fargo, ND (US); David M. Loken, West Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 251 days.

(21) Appl. No.: 18/647,095

(22) Filed: Apr. 26, 2024

(65) Prior Publication Data

US 2025/0169035 A1 May 22, 2025

Related U.S. Application Data

(60) Provisional application No. 63/600,926, filed on Nov. 20, 2023.

(51) Int. Cl.
*H05K 7/20* (2006.01)
*F16J 15/06* (2006.01)

(52) U.S. Cl.
CPC .......... *H05K 7/20272* (2013.01); *F16J 15/06* (2013.01)

(58) Field of Classification Search
CPC ........... H05K 7/20927; H05K 7/20254; H05K 7/20272; H05K 7/20872; H05K 7/20236; H05K 7/20509; H05K 7/20327; H05K 1/0203; H05K 5/0052; H05K 5/0069; H05K 5/069; H05K 7/20281; H05K 1/0209; H05K 1/021; H05K 1/141; H05K 2201/066;

(Continued)

(56) References Cited

U.S. PATENT DOCUMENTS 3,708,245 A 1/1973 King
5,044,430 A 9/1991 Avrea
(Continued)

FOREIGN PATENT DOCUMENTS

JP 2011217547 A 10/2011
TW 201307202 A 2/2013

OTHER PUBLICATIONS

Extended European Search Report and Written Opinion issued in European Patent Application No. 24207173.6 dated Apr. 10, 2025, in 09 pages.

(Continued)

*Primary Examiner* — Michael A Matey

(57) ABSTRACT

In accordance with on embodiment, an electronic assembly comprises a first housing portion having an electronics cavity for housing a circuit board with heat-generating electronic components mounted on the circuit board. A second housing portion has a coolant cavity or coolant channel for circulating a coolant to dissipate heat from the heat-generating electronic component. A gasket is configured to isolate or hermetically seal the electronics cavity from the coolant circulating in the coolant cavity or coolant channel, wherein the gasket comprises seal with two outer lips and a primary channel between the outer lips for conveying coolant to an exit aperture within the primary channel if coolant penetrates one of the outer lips facing the coolant cavity to prevent the ingress of fluid into the electronics cavity.

6 Claims, 12 Drawing Sheets

(58) Field of Classification Search
CPC .... H05K 5/0047; H05K 5/006; H05K 5/0217; H05K 5/061; H05K 7/14; H05K 7/20218; H05K 7/20409; H05K 7/20436; H05K 7/20454; H05K 7/209; H05K 9/0015; H10W 40/47; H10W 40/037; H10W 76/60; F16J 15/06; F16J 15/008; F16J 15/0818; F28F 2265/16; G06F 1/20; G06F 2200/201; H01F 27/025; H01R 13/5202; Y10S 277/914
See application file for complete search history.

(56) References Cited

U.S. PATENT DOCUMENTS 5,066,200 A 11/1991 Ooka
5,090,871 A 2/1992 Story et al.
5,323,292 A * 6/1994 Brzezinski .......... H10W 40/611 361/689
5,562,406 A 10/1996 Ooka et al.
5,703,569 A 12/1997 Oliver et al.
6,313,991 B1 * 11/2001 Nagashima ......... B60R 16/0239 174/16.3
6,331,349 B1 12/2001 Kalinoski et al.
6,370,454 B1 4/2002 Moore
6,387,303 B1 5/2002 Jones et al.
6,404,628 B1 * 6/2002 Nagashima ........ H05K 7/20927 174/547
6,521,164 B1 2/2003 Plummer et al.
7,152,571 B1 12/2006 Wilson et al.
7,177,153 B2 * 2/2007 Radosevich ............ B60L 50/15 165/80.4
7,503,569 B2 3/2009 Duvigneau
8,162,626 B2 4/2012 Fukasaku et al.
8,867,210 B2 10/2014 Harmelink et al.
9,030,063 B2 5/2015 Rawlinson et al.
9,148,946 B1 * 9/2015 Singh ................... H05K 7/2089
9,167,876 B2 * 10/2015 Yamaguchi ............ B65D 53/06
9,315,212 B1 4/2016 Kyrtsos et al.
9,901,004 B2 2/2018 Kang et al.
9,986,806 B1 6/2018 Khodapanah
10,259,339 B1 * 4/2019 Miura ..................... B60L 50/14
10,527,365 B1 * 1/2020 Schlottig ............ H05K 7/20327
10,859,163 B2 12/2020 Reinhart et al.
11,303,183 B2 4/2022 Downs et al.
11,320,058 B2 5/2022 Kidder et al.
11,407,404 B2 8/2022 Kaldobsky et al.
11,420,512 B2 8/2022 Worley et al.
11,938,806 B2 3/2024 Finger-Albert et al.
2001/0014029 A1 * 8/2001 Suzuki .................. H02M 7/003 363/141
2004/0007821 A1 1/2004 Ramsay
2004/0055375 A1 3/2004 Zurek et al.
2004/0188956 A1 * 9/2004 Shibata ................ F16J 15/0881 277/647
2005/0083652 A1 4/2005 Jairazbhoy et al.
2006/0207780 A1 * 9/2006 Shinmura .......... H05K 7/20927 174/50
2007/0193285 A1 8/2007 Knight et al.
2008/0100166 A1 * 5/2008 Stahlhut ................... H02K 1/20 310/156.32
2008/0173088 A1 7/2008 Quill
2008/0285230 A1 * 11/2008 Bojan ................ H05K 7/20872 361/689
2011/0172890 A1 7/2011 Ulrey et al.
2012/0188717 A1 * 7/2012 Albrecht ............ G01R 33/3614 361/699
2012/0212175 A1 * 8/2012 Sharaf ................ H05K 7/20872 220/592.01
2012/0212907 A1 * 8/2012 Dede .................. H05K 7/20927 361/689
2012/0255366 A1 10/2012 Cai et al.
2013/0098315 A1 4/2013 Beyer
2014/0175867 A1 6/2014 Sung et al.
2014/0190665 A1 7/2014 Joshi et al.
2014/0237998 A1 8/2014 Fahrenkrug et al.
2014/0262150 A1 * 9/2014 Icoz .................. H05K 7/20927 165/80.2
2014/0347817 A1 * 11/2014 Joshi ................. H05K 7/20927 361/699
2014/0360772 A1 12/2014 Coppola et al.
2014/0368099 A1 * 12/2014 Schmit ............... H05K 7/20872 312/236
2015/0348869 A1 12/2015 Joshi et al.
2016/0021784 A1 1/2016 Choi et al.
2016/0183409 A1 6/2016 Zhou et al.
2016/0322280 A1 * 11/2016 Schmit .................. H10W 40/47
2016/0379852 A1 12/2016 Tustaniwskyj
2017/0023000 A1 1/2017 Weule
2017/0055378 A1 * 2/2017 Zhou .................. H05K 7/20927
2017/0094837 A1 * 3/2017 Joshi .................. H05K 7/20327
2018/0014418 A1 1/2018 Kang et al.
2018/0130589 A1 5/2018 Yonak et al.
2018/0262089 A1 9/2018 Hatch
2018/0279508 A1 * 9/2018 Roan ................. H05K 7/20254
2018/0331601 A1 11/2018 Zhou et al.
2019/0189329 A1 6/2019 Roan et al.
2019/0223324 A1 7/2019 Le et al.
2020/0340767 A1 * 10/2020 Holden ............. H05K 7/20254
2021/0037676 A1 * 2/2021 Malouin ............ H05K 7/20254
2023/0189487 A1 * 6/2023 Kwon ................ H05K 7/20927 361/699
2024/0224465 A1 * 7/2024 Ringstad ............ H05K 7/20254

OTHER PUBLICATIONS

Delhaise et al., Current usage by a DC motor to vary ratio in an electro-mechanical continuously variable transmission, Sustainable and Integrated Engineering International Conference 2019 (SIE 2019), pp. 1-6, doi:10.1088/1757-899X/884/1/012085.
Des-Case 3-D Bullseye, pp. 1-4, [online], [retrieved on May 20, 2024]. Retrieved from the Internet <URL: https://ro-quip.com/3-d-bullseye-des-case/>.
Edge-Bonded Gasket Sealing Technology, pp. 1-5. Retrieved from the Internet <URL: www.parker.com>.
Gask-O-Seal and Integral Seal Design Handbook, pp. 1-21. Retrieved from the Internet <URL: www.parker.com>.
Integral Seal for Hydraulic Transmission Assembly, pp. 1. Retrieved from the Internet <URL: www.parker.com>.
Mubina Toa et al., Ultrasonic Sensing Basics, Application Note—Texas Instruments, Sep. 2019, pp. 1-15. Retrieved from the Internet <URL: www.ti.com>.
Oil level gauge with electric oil level and temperature monitoring, Kipp item description/product images, pp. 1-2. Retrieved from the Internet <URL: www.kippusa.com>.
Parker Chomerics Extruded EMI Gaskets for Electronics Shielding Products and Custom Solutions Catalog, pp. 1-83. Retrieved from the Internet <URL: www.parker.com>.
Rigid Plastic Sight, 12 in Mounting Centers, Ldi Industries Closed Circuit Liquid Level Gauge, pp. 1-2. Retrieved from the Internet <URL: https://www.grainger.com>.
Spanoudakis et al., Experimental Research of Transmissions on Electric Vehicles' Energy Consumption, Jan. 26, 2019, pp. 1-15, Energies 2019, 12, 388; doi:10.3390/en12030388.

* cited by examiner 18,118
20
20
20
18
18
144
46
12
18
20
18
144
46
12
18
104
20
18
20
20
20
12
112
12
44
18
20
44
2B
20
198
104

ELECTRONIC ASSEMBLY WITH A GASKET FOR VENTING MOISTURE

RELATED APPLICATION

This document (including the drawings) claims priority and the benefit of the filing date based on U.S. provisional application No. 63/600,926, filed Nov. 20, 2023, under 35 U.S.C. § 119(e), where the provisional application is hereby incorporated by reference herein.

FIELD

This disclosure relates to an electronic assembly with a gasket for venting moisture.

BACKGROUND

In some prior art, an electronic device or electronic assembly can be cooled with fluid or coolant, where the coolant is pressurized or pumped to ensure flow through the device or electronic assembly to remove heat, which provides cooling. In certain prior art, there can be multiple cavities with fluids or air that need to remain separate, where a gasket can create a seal between a coolant cavity and an electronics cavity. If the gasket deteriorates or does not perform adequately, there is a risk of the fluid leaking from the coolant cavity, through the seal formed by the gasket, where the electronic device may be damaged or fail from the ingress of the fluid or coolant into the electronics cavity. Thus, there is a need for an improved electronic assembly with a gasket for venting moisture, such as routing the moisture away from the electronics cavity.

SUMMARY

In accordance with one embodiment, an electronic assembly comprises a first housing portion having an electronics cavity for housing a circuit board, where one or more heat-generating electronic components are mounted on a respective thermal plate or on the respective circuit board. A second housing portion or thermal plate has a coolant cavity or coolant channel for circulating a coolant to dissipate heat from the heat-generating electronic component. A gasket is configured to isolate or hermetically seal the electronics cavity from the coolant circulating in the coolant cavity or coolant channel, wherein the gasket comprises seal with two outer lips and a primary channel between the outer lips for conveying coolant to an exit aperture within the primary channel if coolant breaches or penetrates (e.g., leaks or seeps past) an outer lip facing the coolant cavity to prevent the ingress of fluid into the electronics cavity.

BRIEF DESCRIPTION OF DRAWINGS

Like reference numbers in any set of two or more drawings indicate similar or like features, elements, steps or methods.

DETAILED DESCRIPTION

Figure 1:
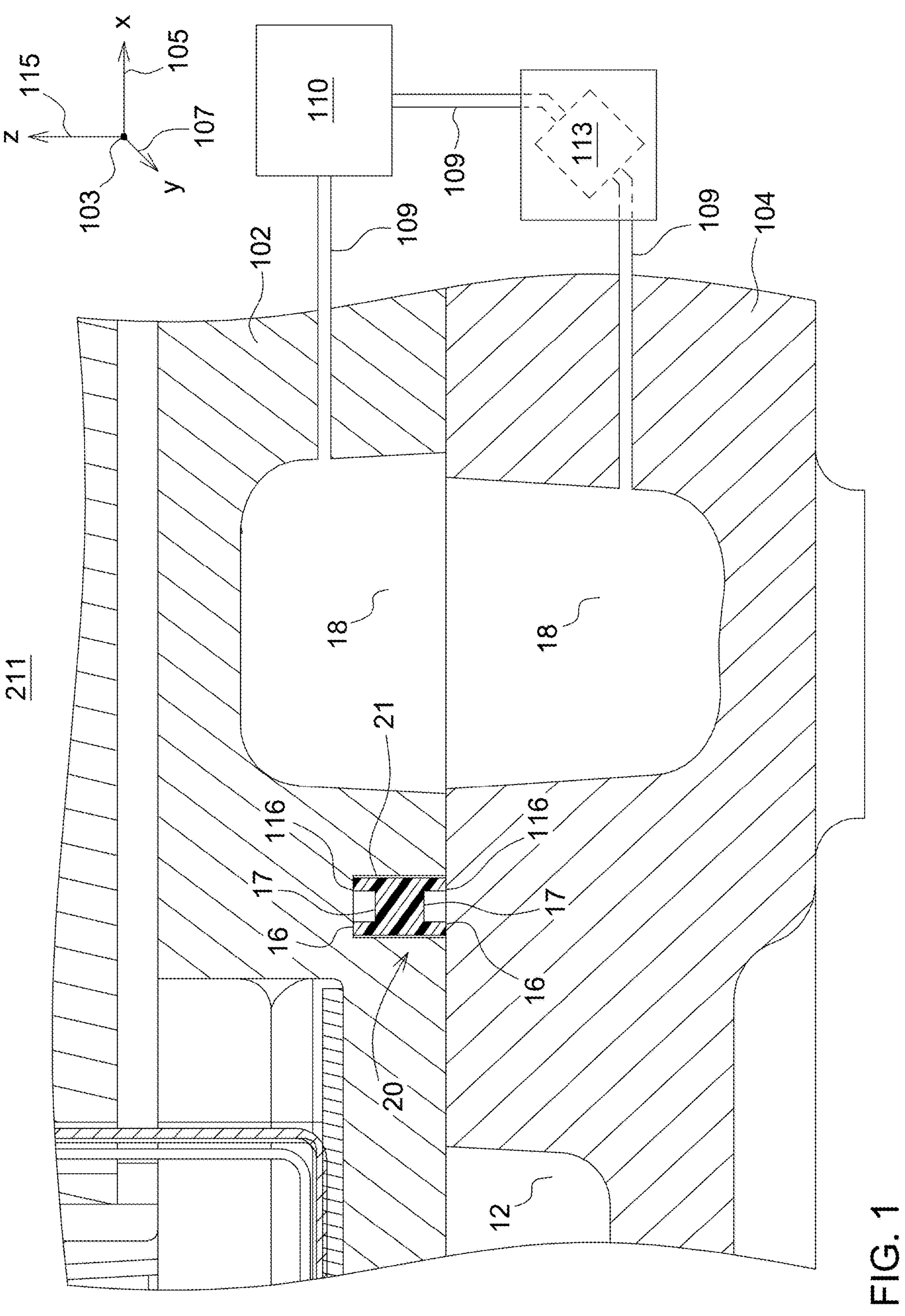
FIG. 1 is a cross-section of one embodiment of an electronics assembly that is connected to a heat exchanger (e.g., radiator) and a pump for circulating a coolant within a coolant cavity of the electronic assembly.

FIG. 1 is a cross-section of electronics assembly 211 that is connected to a heat exchanger 113 (e.g., radiator) and a pump 110 for circulating a coolant (or fluid) within a coolant cavity region 18 of the electronic assembly 211 to dissipate heat from the electronic assembly 211. As illustrated, the heat exchanger 113 and pump 110 are hydraulically connected in series with tubing 109 to circulate coolant (e.g., within a target pressure range and a corresponding flow rate, which is expressed in volume per unit time) within the electronics assembly 211 or the coolant cavity region 18. In one embodiment, the pump 110 is configured to circulate coolant within the electronic assembly 211 to promote adequate dissipation of thermal energy from one or more heat generating electronic components (46, 146), while the target pressure range and/or corresponding flow rate of the coolant is consistent with maintaining a reliable seal of the gasket (20,120) (e.g., with respect to an electronics cavity region 12 that is filled with air at about ambient, external environmental air pressure and/or avoiding or reducing the potential introduction of air or air bubbles into the circulated coolant). Additional tubing 109 connects the heat exchanger 113 and pump 110 to ports (e.g., with suitable connectors, such as compression fittings or threaded fittings) in the housing (102, 104) of the electronic assembly.

Figure 8:
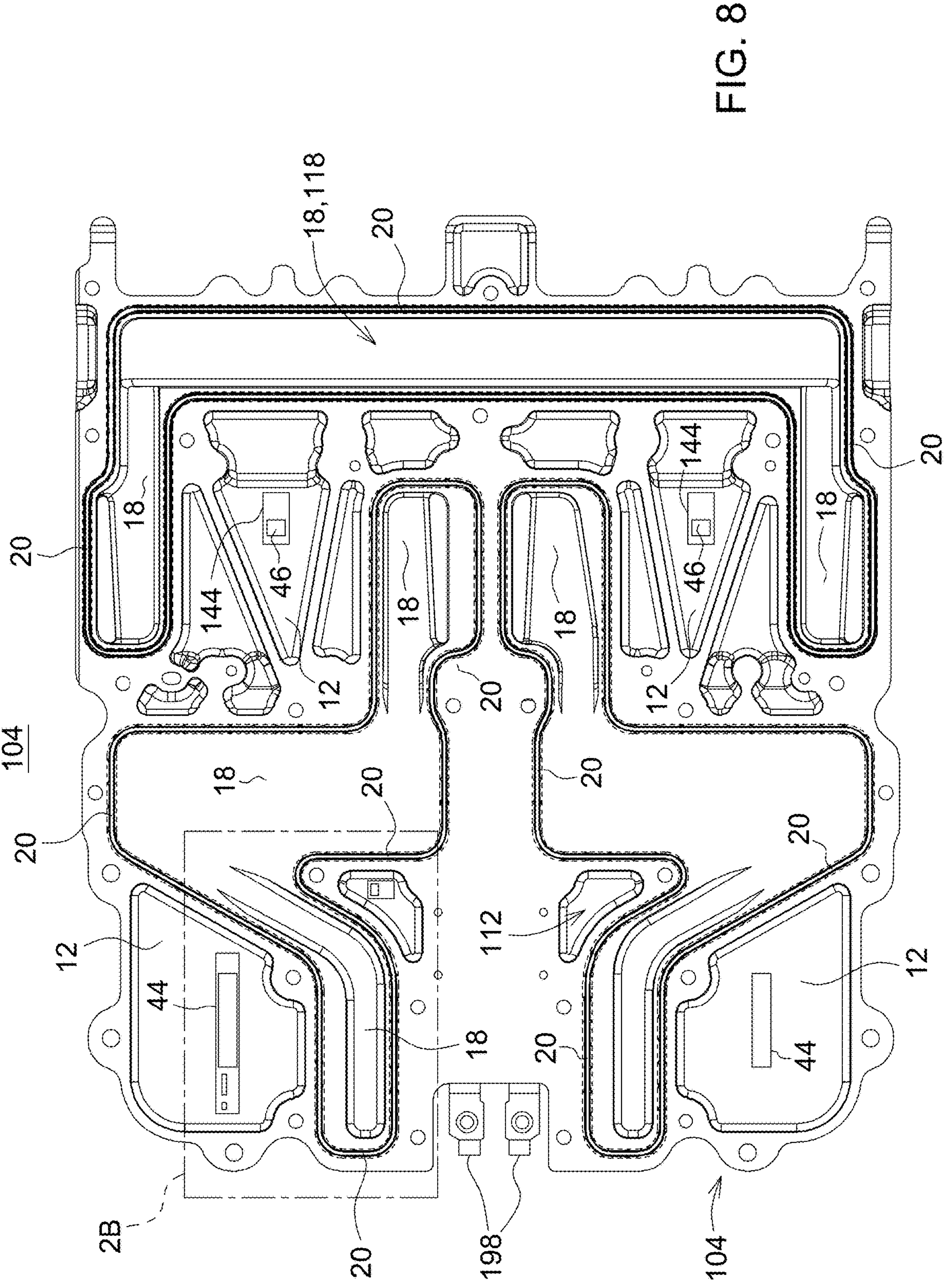
FIG. 8 shows a plan view of the electronic assembly with a second housing portion removed to show an interior or top of the first housing portion.

As illustrated in FIG. 1, the Cartesian coordinate system 103 illustrates the X-axis 105, Y-axis 107 and Z-axis 115, which are substantially perpendicular. The electronics assembly 211 may have electrical terminals 198 (in FIG. 8), such as direct-current (DC) terminals to apply direct current (or alternating current (AC) terminals to apply AC current) to energize one or more circuit boards (44, 144) and the heat-generating electronic components (46,146) associated with the circuit boards. If the electronics assembly 211 provides an inverter, DC-DC converter, power electronics, controller, or sensor, additional output terminals, input terminals or data terminals may be available or accessible to access via connectors on the exterior of the housing (102, 104).

In accordance with one embodiment in FIG. 1, an electronic assembly 211 comprises a first housing portion 104 (or a second housing portion 102, or both) having an electronics cavity region 12 for housing a circuit board 44 with one or more heat-generating electronic components 46 mounted on a respective thermal plate 502 (e.g., heat sink or cold plate assembly) and/or in the respective circuit board 44. Further in some embodiments, an electronics cavity region (12,112) may house circuit boards (44, 144) and heat generating electronic components (46, 146) (e.g., electronic components or electrical components mounted on or in the circuit boards (44, 144)). A second housing portion 102 or thermal plate 502 has a coolant cavity region 18 or coolant channel for circulating a coolant to dissipate heat from one or more heat-generating electronic components 46.

In one embodiment, a gasket 20 is disposed or compressed to seal at an interface between the first housing portion 104 and a second housing portion 102, where the interface may comprise a gasket recess 21, such as a groove, or a channel to receive a portion of the gasket 20. The gasket recess 21 may be located in the first housing portion 104, the second housing portion 102, or both. If the gasket recess 21 is located in both first housing portion 104 and the second housing portion 102, the gasket recess may comprise a first gasket recess in the first housing portion 104 and a second gasket recess in the second housing portion 102, where the first gasket recess and the second gasket recess (e.g., slot or groove in a flange) are aligned or registered spatially in multiple dimensions (e.g., along the X-axis 105, the Y-axis 107, and the Z-axis 115) to receive and retain (e.g., mechanically or by a press fit or interference fit) the gasket 20 if or when the first housing portion 104 and the second housing portion 102 are connected or joined by fasteners. Each of the fasteners may comprise a bolt that engage a cylindrical bore in one housing portion (102, 104) and a threaded bore in an adjoining housing portion (102, 104), for example.

In FIG. 1, a gasket 20 is configured to isolate or hermetically seal the electronics cavity region 12 from the coolant circulating in the coolant cavity region 18 or coolant channel, wherein the gasket 20 comprises a seal with two outer lips (16, 116) and a primary channel 17 between the outer lips (16, 116) for conveying coolant to an exit aperture (e.g., 140 in FIG. 2B and FIG. 3) within the primary channel 17 if coolant breaches or penetrates one of the outer lips (16, 116) facing the coolant cavity to prevent the ingress of fluid into the electronics cavity region 12. As used throughout this document, a lip (16, 116, 216, 316) of any gasket (20, 120) shall be synonymous with a wall of any gasket; accordingly an outer lip (16, 116, 216, 316) shall be synonymous with an outer wall of any gasket (20, 120). The lips or walls are spaced apart from each other by a gap that defines a primary channel (17,117) as a substantially longitudinal channel, such as a groove or channel that can direct, carry or transport fluid, lubricant or coolant. If an outer lip (16, 116) or gasket (20, 120) is breached or penetrated by a fluid or coolant, the outer lip may be referred to as a breached lip, penetrated lip, breached seal, or penetrated seal, for example.

The gasket 20 may be composed of a compressible material, such as an elastomer, (synthetic) rubber, plastic or a polymer, or a composite material that comprises an elastomeric, polymeric or plastic matrix that binds or embeds a filler, such as fiberglass, ceramic reinforcing structures, metallic reinforcing structures, carbon fiber, or the like. The gasket 20 may comprise a preformed compressible flexible gasket with one or more apertures (40,140) in communication with a primary channel 17 to direct or redirect coolant or fluid upon leakage of (at least) one of the two outer lips (16, 116).

Figure 2A:
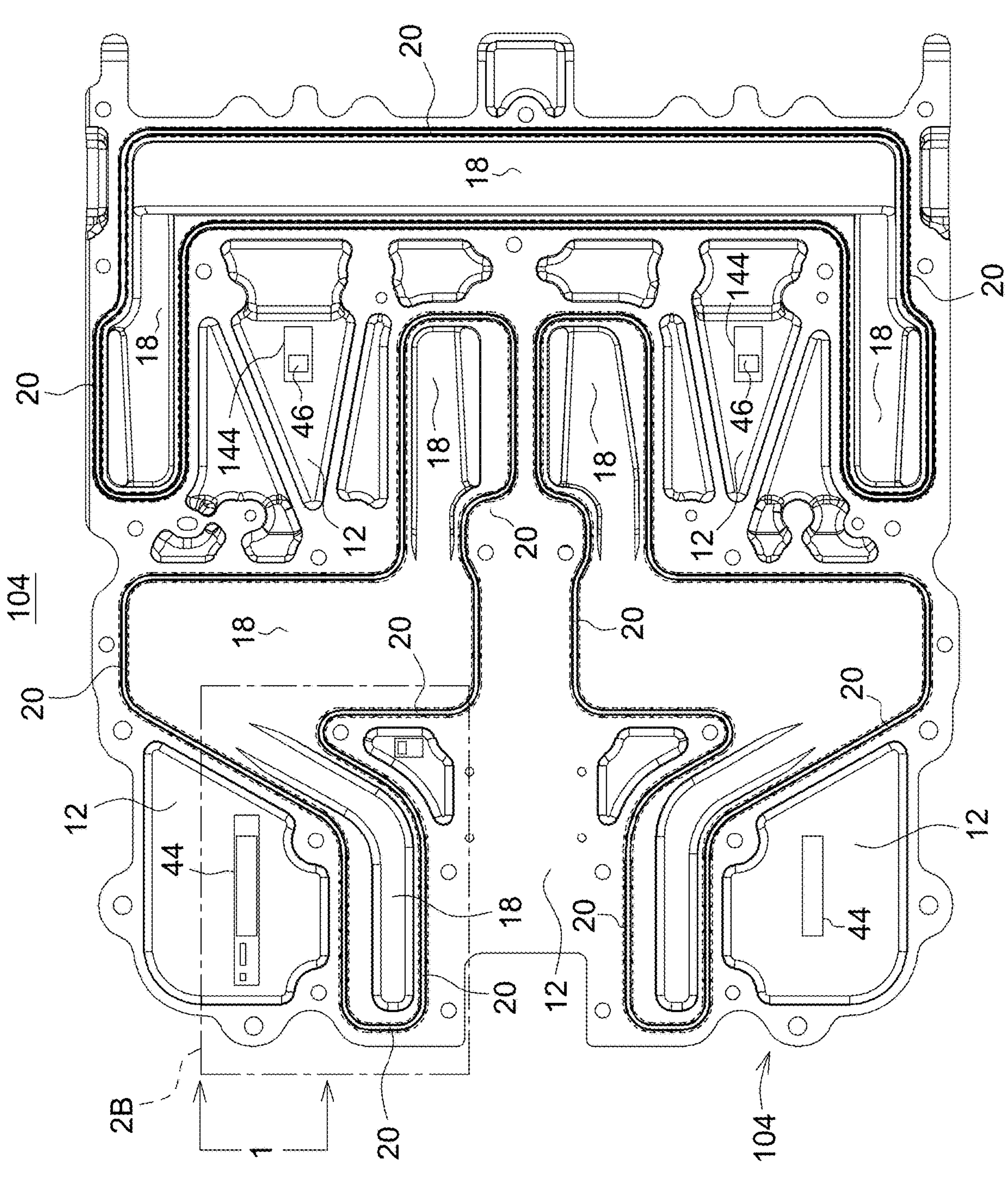
FIG. 2A shows a plan view of one embodiment of the electronic assembly with a second housing portion removed to show an interior or top of the first housing portion.
Figure 2B:
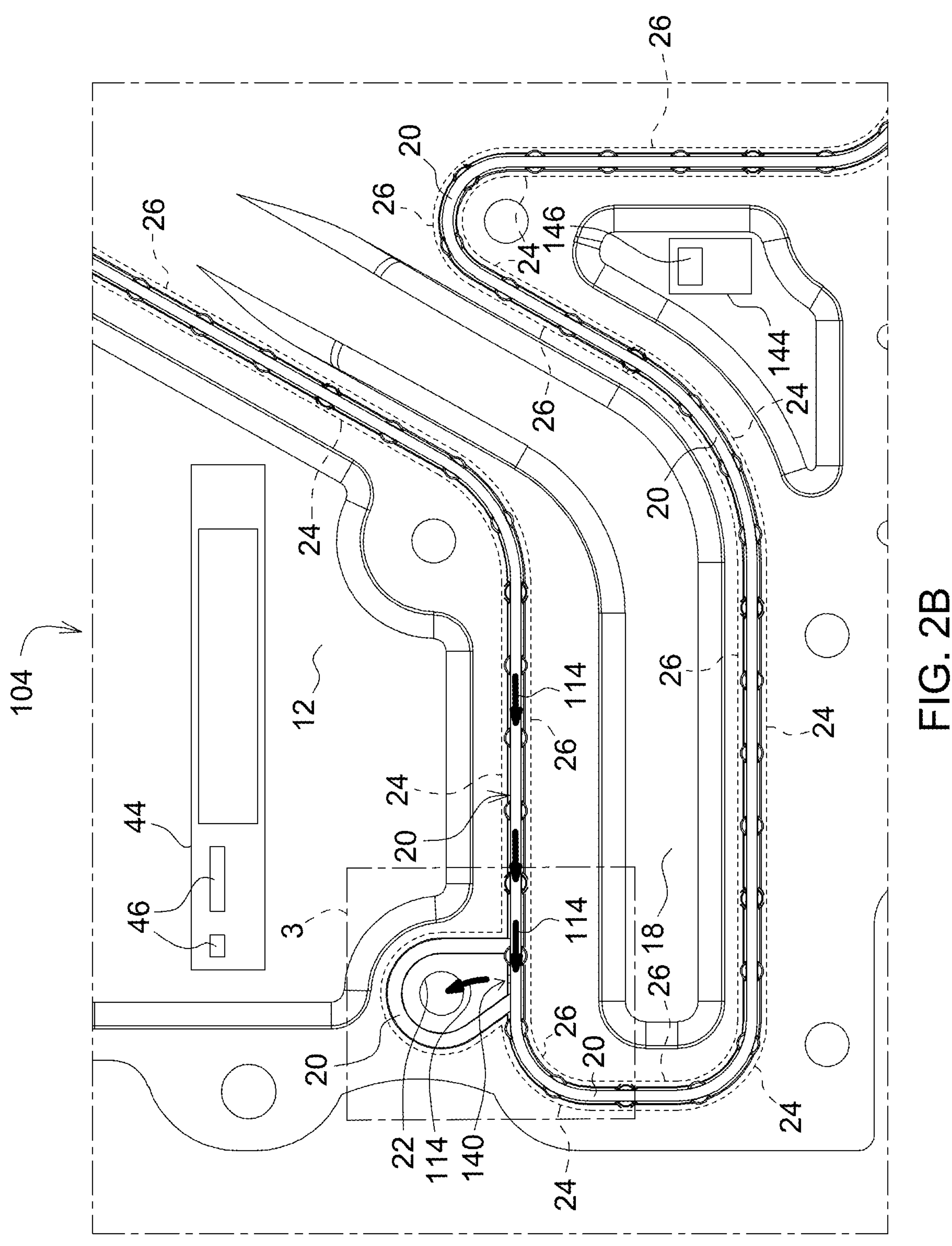
FIG. 2B shows an enlarged portion of FIG. 2A in the rectangular region 2B of FIG. 2A.
Figures 3, 4:
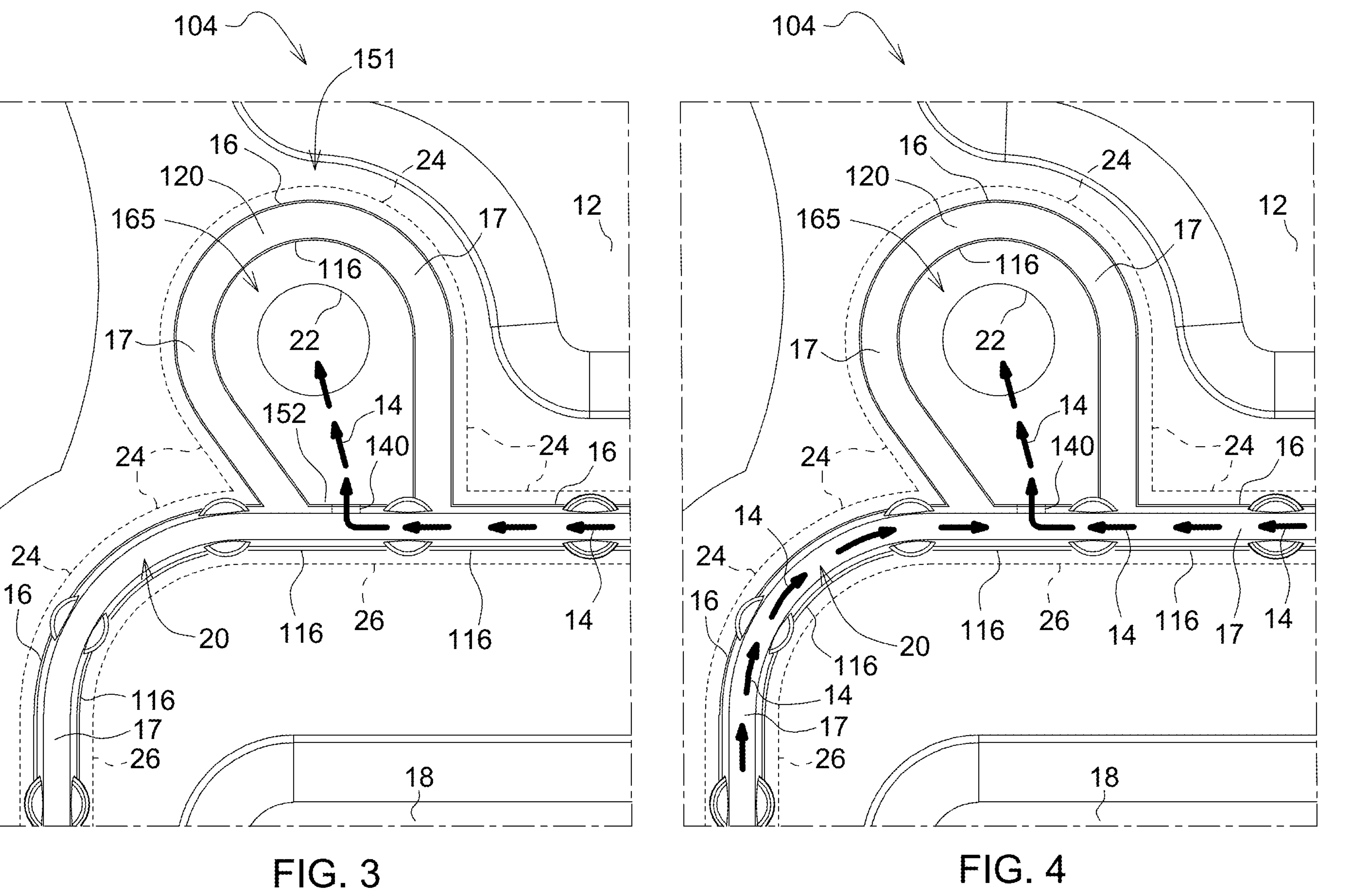
FIG. 3 shows an enlarged portion of FIG. 2B in the rectangular region 3 of FIG. 2B.
FIG. 4 shows an enlarged portion of FIG. 2B in the rectangular region 3 of FIG. 2B with arrows indicating one possible flow path of coolant.

In FIG. 2B, FIG. 3 and FIG. 4, the exit aperture 140 in the wall or lip (16, 116) of the gasket (20,120, 220) forms a passageway between the channel 17 and the relief region 165; the exit aperture 140 may be shown in dashed lines. The exit aperture (40,140) may be connected to gravity feed coolant, liquid, or lubricant, via one or more passageways, channels, conduits, pipes, tubing or otherwise, to a reservoir (not shown) or container for storage or prospective disposal.

In the electronics assembly 211, the exit aperture (40, 140), alone, or together with the venting path, may be configured in accordance with various examples that are cumulative or separately implemented. During a normal state of operation when the gasket (20, 120) is fully functional the auxiliary coolant flow path 14 within and along the channel (17, 117) is inactive and dry. However, during any (partially) breached state of operation of one lip (16, 116, 216, 316) of the gasket (20, 120), the auxiliary coolant flow path 14 or weep path can be active to convey or direct flow of the (leaking) coolant within and along the channel (17, 117) if one or more lips or walls (16, 116, 216,316) of the gasket (20, 120) are hydraulically breached by fluid or coolant.

Under a first example to support a breached state of operation of one lip (16, 116, 216, 316) of the gasket (20, 120), the electronics assembly 211 comprises an exit aperture 140 that is disposed in one side-wall (e.g., of a lip 16 of the gasket 20 or a non-penetrated, non-leaking, or non-breached one of the lips 16) of the gasket, 20, 120, (e.g., which faces the electronics cavity region 12) and wherein the exit aperture 140 vents the primary channel 17; for example, the exit aperture 140 is in hydraulic communication with a relief region 165, which is bounded by a secondary gasket 120 (of FIG. 2B, FIG. 3 and FIG. 4) or another secondary seal to contain the coolant from reaching the electronics cavity region 12. For example, the secondary gasket 120 or secondary seal may have an outer perimeter 151 (in FIG. 3) that surrounds at least partially in inner perimeter 152 of the primary gasket 20 in the region of the exit aperture 140. Further, within or inward from the outer perimeter 151, there may be a vent opening 22 (e.g., vertical hole, vertical drain hole, or vertical channel) in the first housing portion 104 or second housing portion 102: (a) to vent or drain the coolant outside of the electronic assembly 211, or (b) to vent or to drain the coolant to a coolant retention cavity or container (e.g., removable container that is removably attached to the electronic assembly 211).

Under a second example to support a breached state of operation of one lip (16, 116, 216, 316) of the gasket (20, 120), a reservoir or removable container (not shown) comprises a container for holding (e.g., temporarily holding until removed and emptied by a service technician) the vented coolant or received overflow coolant, where the removable container has container threads that engage corresponding housing threads of the first housing portion 104 or the second housing portion 102. For example, a substantially cylindrical container comprises internal female threads along a central axis of the container, an annular gasket or annular seal that coaxially and outwardly located from the central axis to seal a generally planar end of the container to the housing of the electronic assembly 211, and one or more intermediate holes in the generally planar end of the substantially cylindrical container between the central axis and the annular seal to allow the coolant, fluid, or lubricant to drip or flow into the container.

Under a third example to support a breached state of operation of one lip (16, 116, 216, 316) of the gasket (20, 120) in accordance with an alternate embodiment of an electronic assembly 311 (of FIG. 5 and FIG. 6) in the first housing portion 104 or the second housing portion 102 there is a secondary channel 42, such as a drain channel or vertical channel, that: (a) may be generally perpendicular to the primary channel 17 and (b) if a lip of the gasket is breached, the secondary channel 42 serially receives coolant from the primary channel 17 to route the received coolant away from one or more electronics cavity regions 12 or to route the coolant outside of the electronics assembly 311 (e.g., to the ground for suitable water coolant in compliance with applicable laws and regulations), or to a coolant overflow container (e.g., removable container).

Under a fourth example (of FIG. 5 and FIG. 6) to support a breached state of operation of one lip (16, 116, 216, 316) of the gasket (20, 120), the exit aperture 40 is disposed within a central portion or bottom wall of the primary channel 17 of the gasket 20. For example, the exit aperture 40 is disposed within a central portion or bottom wall 30 between the lips 16 of the gasket 20. Further, one or more lips 16 of the gasket 12 may isolate coolant from an electronics cavity region 12 that is bounded by an adjoining lip 16 or coolant cavity adjoining lip 16 of the gasket 20.

Under a fifth example to support a (partially) breached state of operation of one lip (16, 116, 216, 316) of the gasket (20, 120), the exit aperture is disposed: (a) as exit aperture 140 within a sidewall of the gasket 20; (b) as exit aperture 40 within a central portion, or bottom wall 30 of the primary channel 17 of the gasket 20, or both. Further, in some embodiments, the exit aperture 40 is configured to have a reinforcing member 41, strip, cross or grid that radially traverses the aperture (e.g., to add structural support to the gasket 20).

In one embodiment, the gasket 20 has outer lips (16, 116) that are connected via a perpendicular bottom wall 30, where the bottom wall 30 and outer lips (16, 116) define a primary channel 17 for venting fluid along an auxiliary coolant flow path (14, 114) (e.g., primary coolant flow path) of the gasket 20 or a gasket recess in the housing (102, 104) that retains, contains, supports, or receives the gasket 20 on a planar flange or within a gasket recess in a substantially planar flange. In certain configurations, the bottom wall 30 comprises a transverse portion of gasket 20 that joins the outer lips (16, 116).

A first outer lip or outer lip (16, 116) of the gasket 20 may define a boundary of the electronics cavity region 12; such first outer lip that faces or bounds the electronics cavity region (12, 112) can be referred to as an electronics-cavity-adjoining lip. A second outer lip (16, 116) or outer lip (16, 116) of the gasket 20 may define a boundary of the coolant cavity region 18; such second outer lip that faces or bounds the coolant cavity region 18 can be referred to as a coolant-cavity-adjoining lip. The first outer lip or the second outer lip (16, 116) may also face or bound a lubricant cavity region 106 to isolate the lubricant (e.g., oil or hydraulic fluid) from an electronics cavity region (12, 112), a coolant cavity region (18, 118), or both.

In certain configurations, the gasket 20 has a generally H-shaped cross-section, although an h-shaped cross-section (e.g., a modified H-shape with one segment of the H deleted), a U-shaped cross section, a polygonal cross-section with one or more recessed channels (17, 117, 217) or generally rectangular cross-section with one or more recessed channels (17,117, 217) can be used, for example. In some embodiments, the gasket 20 is commercially available and can be structured as a unitary or monolithic seal that creates two distinct sealed volumes or regions (e.g., sealed electronics cavity region 12 region and a sealed coolant cavity region 18) in close proximity. Here, the gasket 20 is improved by using the primary channel 17, such as a recess, groove, slot, air gap, or mini-aqueduct-like space between the two lips (16, 116) of the gasket 20, to transport any leaking liquid (if present) or coolant (if present). If any leaking fluid or leaking coolant is present in the channel (17, 117, 217) (e.g., migrating, seeping or osmotically present from sealed the coolant cavity region 18), the channel (17, 117, 217) directs the leaking coolant or fluid along an auxiliary coolant flow path (14, 114) defined by the channel (17, 117, 217) of the gasket 20 or gasket recess 21 in the housing (102, 104) to a relief region (e.g., 165) of lower pressure than the coolant within the coolant cavity region 18; greatly reducing the risk of fluid or coolant getting into the electronics cavity region 12.

In accordance with one embodiment, the gasket 20 requires a minimum of two seal edges, two walls, or two lips (16, 116) and a primary channel (17, 117, 217) that defines hollow space, gap, recess, groove, or auxiliary coolant flow path 14 between the seal edges, walls or lips 16. Further, the primary channel (17, 117, 217) is of sufficient cross-section to direct or divert the coolant to or through the exit aperture (40, 140) to prevent coolant from entering into the electronic cavity region 12 (e.g., via one of the lips (16, 116) of the gasket 20). If any fluid or coolant is present in the channel (17, 117, 217), the former dry air gap of the channel (17, 117, 217) becomes a fluidic path that may be referred to as an auxiliary coolant flow path 14, a weep path, or a vent path. The auxiliary coolant flow path 14, a weep path, or a vent path vents or directs coolant away from the electronics cavity region (12, 112) in the event that the coolant or other fluid breaches one of the lips (16, 116, 216, 316) of the gasket, for example.

In an alternate embodiment, the gasket 20 may comprise two separate elastomeric lip seals (e.g., with generally rectangular cross sections or generally L-shaped cross sections) that are spaced apart in the X-Y plane (e.g., defined by the intersection of the X-axis 105 and Y axis 107) by an intermediate spacer of lower height (e.g., along the Z-axis 115) than the lip-seal height of lip seals in a single common (e.g., wide) recess in a flange of the housing (102, 104)) to define a primary channel (17, 117, 217) in an air gap between the two separate elastomeric seals.

In yet another alternate embodiment, the gasket 20 may comprise two separate elastomeric lip seals (e.g., with generally rectangular cross sections or generally L-shaped cross sections) that are in a common recess and spaced apart in the X-Y plane (e.g., defined by the intersection of the X-axis 105 and Y axis 107) by an air gap between the two separate elastomeric lip seals.

FIG. 2A shows a plan view of the electronic assembly 211 with a second housing portion 102 removed to show an interior or top of the first housing portion 104. In FIG. 2A, reference number 1 shows how the view of the cross-section of FIG. 1 relates to FIG. 2A. Like reference numbers in FIG. 1 and FIG. 2A indicate like elements or features.

FIG. 2A provides illustrative examples of one or more electronics cavity regions 12 of the housing (e.g., first housing portion 104) that are spaced apart from one or more coolant cavity regions 18. The gasket 20 or set of gaskets 20 track circuitous or serpentine paths between the electronics cavity regions 12 and the coolant cavity regions 18. The gasket 20 or set of gaskets 20 overlines a flange, with or without a recess for accepting the gasket 20, that tracks a circuitous or serpentine paths between the electronics cavity regions 12 and the coolant cavity regions 18. Further, the gasket 20 or set of gaskets 20 provides fluidic isolation and reliable sealing between the electronics cavity regions 12 and coolant or fluid within the coolant cavity regions 18.

FIG. 2B shows an enlarged portion of FIG. 2A in the rectangular region 2B of FIG. 2A. In FIG. 2B, the gasket 20 is bounded on a first side (e.g., along coolant seal region 26) by one or more coolant cavity regions 18 and on a second side, which is opposite the first side, (e.g., along an electronics seal region 24) by one or more electronics cavity regions 12. At the first side, the gasket 20 is configured to seal or isolate the coolant within the coolant cavity region 18: (a) from the primary channel 17 and (b) from the electronics cavity region 12 during normal or ordinary operation of the electronics assembly (211, 311). Similarly, at the second side, the gasket 20 is configured to seal or isolate the coolant within the coolant cavity region 18: (a) from the primary channel 17 and (b) from the electronics cavity region 12 during normal or ordinary operation of the electronics assembly (211, 311).

In some configurations or alternate configurations during normal state of operation, the coolant cavity region (18, 118) can be located on the first side of the gasket 20 or the second side of the gasket 20, where the electronics cavity region (12, 112) is located on an opposite side of the gasket 20 from (e.g., with respect to) the coolant cavity region (18, 118). However, during a breached state of operation, seeping, leaking or hydraulic breach of coolant occurs (e.g., at one or more points or segments) along breached lip (e.g., 16, 116, 216, 316) of the (coolant) seal region 26; hence, from the coolant cavity region 18, (leaking) coolant is routed and retained within the primary channel 17 of the gasket 20 toward the exit aperture 140, which comprises an opening in the sidewall of the non-breached lip (e.g., 16, 116, 216, 316) or, alternately, an opening in the bottom wall 30 of the channel 17. Further, except for any exit aperture 140 in the wall (e.g., sidewall or lip) of the gasket (20, 120), the non-breached lip (16, 116) remains intact at the (electronics) seal region 24 to prevent the flow of coolant into the electronics cavity region 12 (e.g., potentially aided by the pressure relief afforded by the exit aperture 140 that is in communication with a relief region 165, alone, or in conjunction with vent opening 22).

In FIG. 2B, the concept of the pressure relief path 114 is generally illustrated by the arrows, where the fluid or coolant generally flows: (a) from the coolant cavity region 18 to the exit aperture (40,140), and (b) from the exit aperture (40, 140) to the vent opening 22, which in turn drains the fluid, coolant, or lubricant by gravity to a reservoir or container which can be emptied or disposed of as service is needed. Further, in FIG. 2B, the concept of the pressure relief path 114 does not apply during normal state of operation no fluid or fluid flows into the vent opening 22 and the channel (17, 117, 217) of the gasket is dry. However, the concept of the pressure relief path 114 applies during leakage state where one of the lips (16, 116) of the gasket 20 is breached by the ingress of coolant, fluid or lubricant. The arrows 114 of FIG. 2B could be located at any leaking or seeping point or segment of the lip (16, 116), which faces the coolant cavity region 18, and allows the coolant, fluid or lubricant to enter the channel (17, 117,217) of the gasket so that it can be diverted by the exit aperture (40, 140) to the vent opening 22.

FIG. 3 shows an enlarged portion of FIG. 2B in the rectangular region 3 of FIG. 2B. Like reference numbers in any two drawings indicate like elements or features.

FIG. 3 shows a breached state of the gasket 20 at a wall or lip (16, 116) that is facing the coolant cavity region 18. Accordingly, as indicated by arrows that represent auxiliary coolant flow 14, first, coolant or fluid flows into the channel 17 and, second, the coolant or fluid flows within the central channel 17, where it is diverted initially to the exit aperture 140 and subsequently to the drain hole 22 to protect the electronic components (46, 146) within the electronics cavity region 18 from the influx or ingress of moisture, coolant, fluid or lubricant from the coolant cavity region 18. In the absence of the gasket 20, with its accompanying channel (17, 117, 217) and exit aperture (40, 140), to divert moisture, coolant fluid or lubricant from the electronics cavity region (12, 112) in accordance with the disclosure, the ingress or influx of moisture, coolant, fluid or lubricant that conducts electricity would tend to make the electronic components (46, 146) and circuit boards (44, 144) susceptible to short-circuits, permanent damage, or inoperability of electronic circuits, among other things.

FIG. 4 shows an enlarged portion of FIG. 2B in the rectangular region 3 of FIG. 2B with arrows indicating one possible flow path of coolant along the coolant flow path 114 or weep path. In FIG. 3, the auxiliary coolant flow path 14 is illustrated as unidirectional within the channel 17 of the gasket 20, whereas in FIG. 4, the auxiliary coolant flow path 14 is illustrated as by bidirectional, based on the arrow, that track the channel 17 of the gasket 20.

In some configurations, auxiliary coolant flow path 14 (e.g., weep path) routes fluid or coolant to a vent opening 22 via the exit aperture (40, 140) of protect the electronic components (46, 146) in the enclosure or electronic assembly 211. In other configurations, the auxiliary coolant flow path 14 routes fluid or coolant to a removable container, which can be emptied from time to time by a vehicle user or technician.

For example, the electronics assembly (211, 311) is configured with an auxiliary coolant flow path 14 (e.g., weep path) or venting path along the gasket 20 or gasket recess 21 to prevent a cascaded compromise (e.g., cascaded breach) of a dual lip 16 seals or multiple lip seals placed in series, where once the initial lip (16, 116) seal is compromised the breaching fluid or coolant could start to pressure (with possibility of breaching) the next lip (16, 116) seal or next sealing surface. Further, the auxiliary coolant flow path 14 (e.g., weep path) is configured where an air pressure or hydraulic pressure at an exit aperture (e.g., 40, 140) or outlet of the weep path or auxiliary coolant flow path 14 is equal to or lower than an air pressure of an electronics cavity region 112 (e.g., electronics air pocket) or any hydraulic pressure (if any suitable dielectric fluid is normally kept) in the electronics cavity region 12.

In some embodiments, the electronics cavity region 112 (e.g., electronics air pocket) is configured to contain or house one or more circuit boards 44 with heat-generating components (46, 146), whereas the coolant cavity region 118 is configured to contain coolant under hydraulic pressure within a target hydraulic pressure range. Prior to a breach of one or both lips 16 of the gasket 20, the auxiliary coolant flow path 14 (e.g., weep path) can be maintained at a lower pressure (e.g., lower air pressure, lower hydraulic pressure) than that of electronics cavity region (12, 112) (e.g., an electronics air pocket) that holds or houses one or more circuit boards 44 with heat-generating electronic components, 46, 146 to facilitate the venting or routing of coolant or liquid to an exit or container upon breach of one lip 16 (e.g., wall) of the gasket 20, instead of building pressure onto the next lip 16 seal (e.g., remaining lip seal that separates the primary channel 17 from the electronics cavity region 12).

In one embodiment, the gasket 20 can be configured as a single gasket 20 with dual lips 16 or dual walls for sealing or isolating electronics cavity that houses electronics from lubricant, fluid or coolant. However, in an alternate embodiment, a pair of parallel gaskets 20 (e.g., inner gasket and an outer gasket) can replace the single gasket 20, where each one of the parallel gaskets 20 has respective outer lips, outer walls, outer seals or outer sealing edges with a channel 17 between the respective outer lips, outer walls, outer seals or outer sealing edges. Further, if the two parallel gaskets are spaced apart by an intermediate gap, the intermediate gap and the exposed surface of the electronic assembly within the gap may define an auxiliary channel or primary alternate primary channel 17 between the two gaskets 20 that route coolant, liquid, or lubricant along the auxiliary channel. For example, in an alternate embodiment, the two gaskets comprise inner gasket and an outer gasket, where an outer perimeter of an outer gasket tracks the inner perimeter of an inner gasket by the gap (e.g., radial gap) within a range or tolerance.

In another alternate embodiment, the above pair of parallel gaskets 20 are integrally formed to establish an integral dual gasket having two or three central longitudinal channels between the walls of the parallel gaskets.

Figures 5, 6:
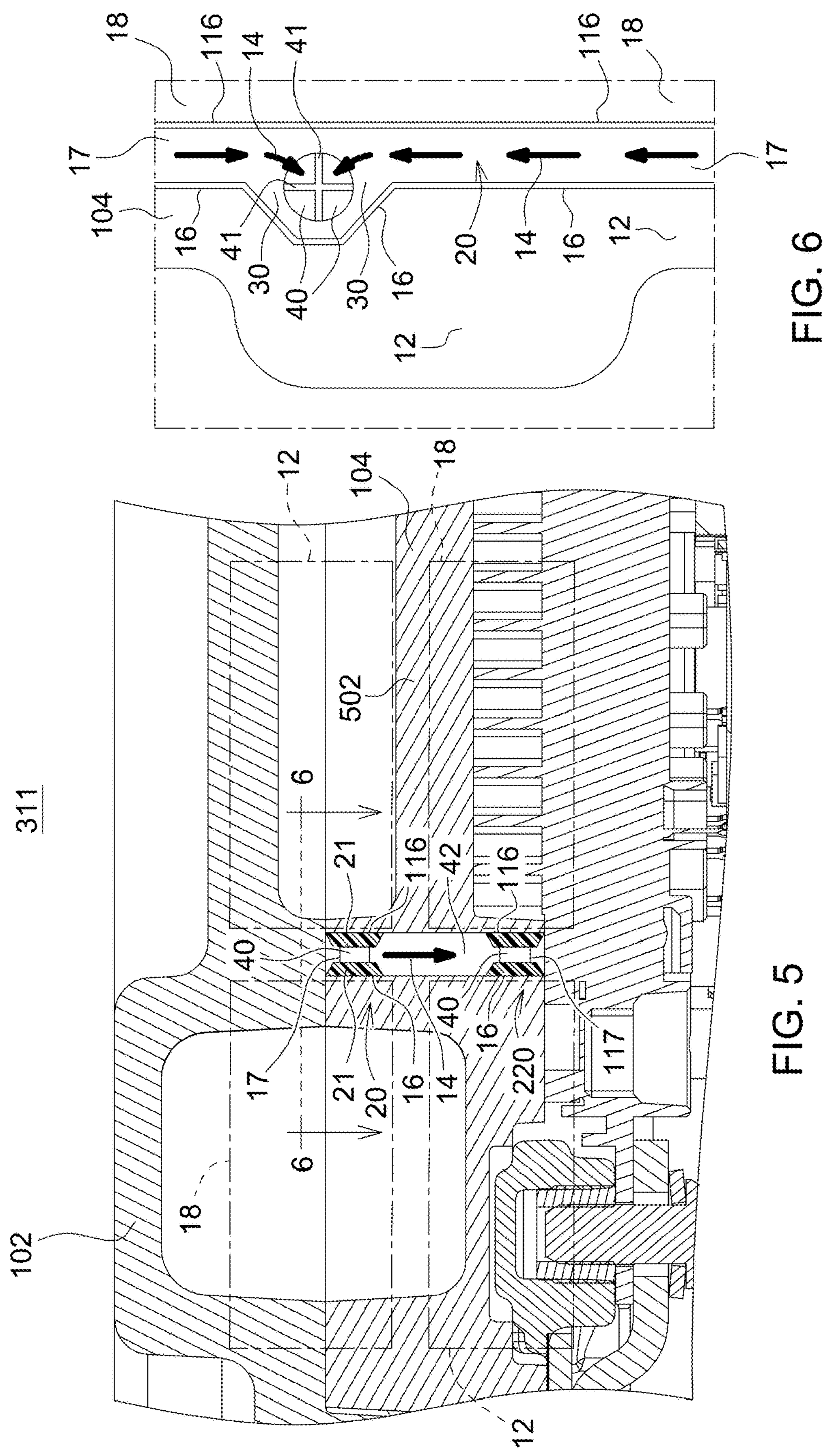
FIG. 5 shows a cross-section of an electronics assembly comprising a first housing portion and a second housing portion in the region of a venting or drain channel (e.g., vertical channel).
FIG. 6 shows a plan view of the electronic assembly with a second housing portion removed to show an interior or top of the first housing portion as viewed along reference line 6-6 of FIG. 5.
Figure 7:
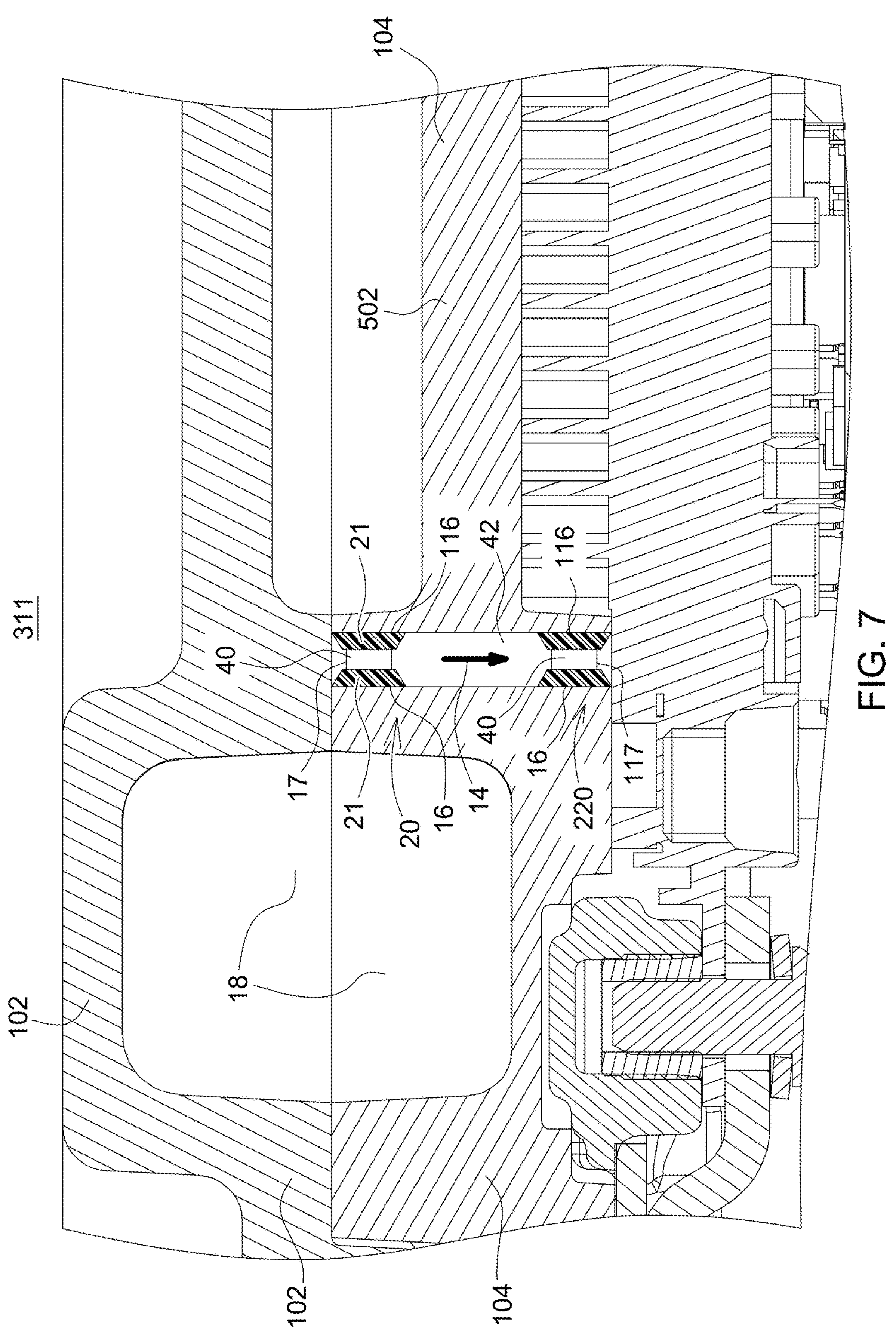
FIG. 7 shows an enlarged cross-section of an electronics assembly of FIG. 5 comprising a first housing portion and a second housing portion in the region of a venting or drain channel (e.g., vertical channel).

FIG. 5 and FIG. 7 each show a cross-section of an electronics assembly 311 comprising a first housing portion 104 and a second housing portion 102 in the region of a secondary channel 42, such as a venting or drain channel (e.g., vertical channel with a longitudinal path along the Z axis 115). The secondary channel 42 provides a hydraulic connection for any coolant or any fluid present (e.g., channel 17 is generally dry during normal operation of the electronic assembly) to flow between a primary channel 17 of a first gasket 20 (e.g., primary gasket) and an alternate primary channel 117 of a second gasket 220, where the primary channel 17 and the alternate primary channel 117 support the flow of coolant or fluid at different vertical levels (e.g., along the Z-axis 115) of the electronic assembly (e.g., to support diversion or routing of any leaking coolant or fluid to the exit aperture (40, 140) and away from the electronics cavity region (12, 112). For example, the primary channel 17 of the first gasket 20 may generally direct coolant to flow in a first plane (e.g., first X-Y plane), whereas the alternate primary channel 117 of the second gasket 220 may generally direct coolant to flow in a second plane ((e.g., second X-Y) that is spatially separated from the first plane by a substantially uniform distance along the Z axis 115.

FIG. 6 shows a plan view of the electronic assembly 311 with a second housing portion 102 removed to show an interior or top of the first housing portion 104 as viewed along reference line 6-6 of FIG. 5. In FIG. 6, the first gasket 20 has an aperture 40 in the bottom 30 (e.g., bottom wall or floor) of the first gasket 20 between two outer lips (16, 116), where any coolant can be directed or diverted from the primary channel 17 of the first gasket 20 vertically within the secondary channel 42 to alternate primary channel 117 of the second gasket 220.

In some configurations, a gasket 20 has an exit aperture (40, 140) or hole in the primary channel 17 (or alternate primary channel) to redirect coolant along the auxiliary coolant flow path 14 (e.g., weep path) that routes coolant or fluid through the aperture (40, 140) or hole and away from the electronics cavity region 12, and away from the electronic components (46, 146) that are susceptible to or vulnerable to damage (e.g., short circuits) from electrically conductive coolant or fluid. Accordingly, the hole or exit aperture (40, 140) in the primary channel 17 (or alternate primary channel) can connect segments of a weep path or auxiliary coolant flow path 14, such as weep path segments of one or more primary and secondary gaskets. Further, the primary and secondary gaskets that are configured to communicate hydraulically with each other can be located in a common plane (with the gasket 20) or in one or more different planes (e.g., different vertical planes separated by a vertical dimension, along the Z axis 115). The auxiliary coolant flow path 14 or weep path tends to reduce the risk of coolant getting into the electronics cavity region 12, or contacting the (energized) heat-generating electronic components (46, 146) in the electronics cavity region 12 (which could lead to short-circuits between terminals of the electronic components 46, 146, among other possible malfunctions).

In some embodiments, exit apertures (40, 140) or other openings are placed to allow coolant to flow between or among primary channels of one or more gaskets 20. In alternate embodiments, Tee or "Y" transitions or junctions route the coolant through channels of various gaskets, where the channels may be configured in parallel or series with each other.

In FIG. 3 and FIG. 4, an exit aperture 140 in the side-wall or lip of a gasket 20 or in FIG. 5 and FIG. 6 an aperture 40 in the bottom wall (e.g., floor) of a gasket 20, alone, or together with a secondary channel 42 (e.g., vertical channel of FIG. 5 or FIG. 7) can be configured (e.g., in series) to create auxiliary coolant flow path 14 or weep path with minimal space, such as within an electronics assembly (211, 311), such as an inverter, converter, or power electronics. For example, the exit apertures (40, 140) and secondary channels 42 can be used to connect hydraulically, coolant flow paths 14 or weep paths on same planes and different planes (e.g., distinct X-Y plans separated by an uniform displacement in the Z-axis 115 direction of the Cartesian coordinate axes 103) of the electronics assembly, where ultimately the coolant can exit device or move to a removable container that can be emptied later.

Advantageously, the gasket 20 with dual lips 16 can save space within the electronics assembly (211, 311) in comparison to a configuration with two separate gaskets 20, such as an inner gasket 20 and an outer gasket 20 (which are spaced apart from each other) with an intermediate weep channel in the housing.

The electronics assembly (e.g., 211, 311) of this disclosure facilitates an auxiliary coolant flow path 14 (e.g., weep path), a vent path or routing path to allow moisture or coolant that has passed one lip 16 of the gasket 20 to exit the assembly or to move coolant to a container or designated collection volume that can collect the coolant. The electronics assembly is well-suited to move fluid away from the electronics cavity region 12 seal to the outside of the component or to a storage location.

For example, the electronics assembly is configured with a relatively low pressure auxiliary coolant flow path 14 (e.g., weep path) or venting path along the gasket 20 or gasket recess 21 (with respect to the pressure of the electronics cavity region 12) to prevent cascaded compromise of a dual lip seals or multiple lip seals placed in series, where once the initial lip 16 (its lip seal, or its seal) is compromised the breaching fluid or coolant will start to pressure onto the next lip 16 (its lip seal, or its seal) or next sealing surface. The relatively low pressure auxiliary coolant flow path 14 (with respect the interior pressure (e.g., air, fluidic or hydraulic pressure) of the electronics cavity region 12) facilitates the venting or routing of coolant or liquid to an exit or container, instead of building pressure onto the next lip 16 (or its seal).

Figure 9:
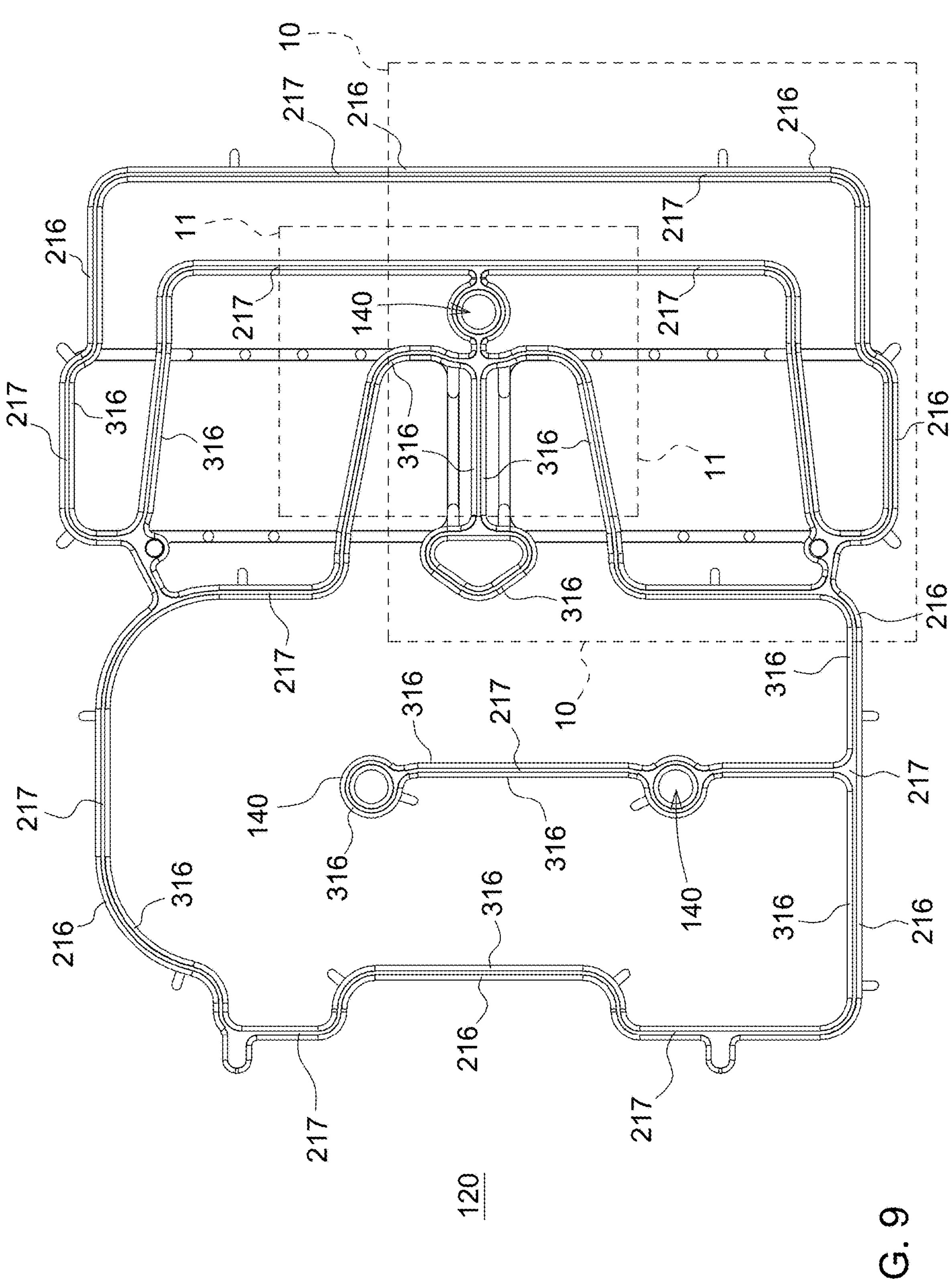
FIG. 9 shows a plan view of one embodiment of a gasket, where the gasket is illustrated as separate from or removed from the electronic assembly.

FIG. 9 shows a plan view of one embodiment of a gasket 120, where the gasket 120 is illustrated as separate from or removed from the electronic assembly (e.g., 211). The gasket of FIG. 9 can be defined as a path or sealing path (e.g., circuitous path) that comprises curved segments and linear segments that are connected end to end to form the gasket 120. The path, shape and size (e.g., dual walled gasket 120 with a central, longitudinal channel 217) of gasket 120 corresponds to or is related to one or more of the following: (a) perimeter of a first housing portion; (b) a perimeter of the second housing portion; (c) a sealed boundary to isolate fluid or coolant (e.g., under target range of hydraulic pressure) within coolant chambers, central channel(s) 217, coolant regions, coolant cavities, or coolant volumes within the electronic assembly from non-coolant regions (e.g., electronic chambers, electronic regions electronic volumes to house electronic circuit boards and components); (d) a sealed boundary to isolate air (e.g., at ambient pressure or charged or pressurized within a target range of air pressure) and electronic circuits, electronic components, electrical circuits and electrical components from fluid or coolant, where electronic chambers, electronic regions electronic volumes house electronic circuit boards, electronic circuits, electrical circuits, and electrical or electronic components in an air-filled volume; (e) a sealed boundary to isolate transmission fluid or oil (e.g., under target range of hydraulic pressure) within coolant chambers, central channels 217, coolant regions, coolant cavities, or coolant volumes within the electronic assembly from non-coolant regions (e.g., electronic chambers, electronic regions electronic volumes to house electronic circuit boards and components); and (f) a sealed boundary to isolate air (e.g., at ambient pressure or charged or pressurized within a target range of air pressure) and electronic circuits, electronic components, electrical circuits and electrical components from hydraulic fluid or oil, where electronic chambers, electronic regions electronic volumes house electronic circuit boards, electronic circuits, electrical circuits, and electrical or electronic components in an air-filled volume.

In FIG. 9, the gasket 120 has a cross-section with an outer wall 316 (e.g., an outer lip), an outer wall 216 (e.g., an outer lip) and a central channel 217 (e.g., central longitudinal channel for diverting coolant). The channel 217 may track curved segments or generally straight segments as viewed in a plan view. Further, the gasket 120 also has pedestals (167, 169 in FIG. 10) that may engage or extend into vias (e.g., for mechanical retention of gasket 120) that are present in the first housing portion 102, the second housing portion 104, any circuit board (44, 144), or other components of the electronic assembly (211, 311). As illustrated in FIG. 9, there are several features that allow leaking fluid or coolant to flow into and through a central channel 217 (e.g., if one or more walls of the gasket 120 are breached) to a collection chamber or collection container (e.g., via an exit aperture (40, 140) in the wall or lip (216, 316) of the gasket 120 and one or more vertical channels in the gasket 120 and/or in the housing (102, 104) of the electronic assembly). The central channel 217, alone or in cooperation with any exit aperture (40, 140), is configured to perform analogous functions to any channel (17, 117) in other embodiments set forth in this disclosure for a breached state of operation of the outer lips or outer walls (216, 316), such as conveying or directing fluid or coolant originating from the coolant cavity region (18, 118) away from the electronics cavity region (12, 112). Further, the outer walls (216, 316) of the gasket 120 are configured to perform analogous functions to the outer lips (16, 116) in other embodiments set forth in this disclosure, such as protection of the electronic components (12,112) in the electronics cavity region (12, 112) from the ingress of coolant, fluid, or lubricant (e.g., during normal state of operation of the gasket 120 or during a partially breached state of one wall or lip of the gasket 120).

In one embodiment, the gasket 120 is formed by dispensing uncured elastomer, polymer, or plastic as a bead or extruded material that adheres to the surface or within a slot, recess or groove in a flange of a housing (102, 104) or other portion of the electronic assembly (211, 311), where the dispensed or extruded cross section if the bead has at least one channel 217 (e.g., central channel or longitudinal channel). Further in some embodiments, a removable mold, removable female mold, removable male mold, removable frame, or removable skeleton is configured to form, retain, or mold one or more channels 217, vertical channels (e.g., drains with exit aperture 140), or other mechanical features in the dispensed or extruded cross section of the gasket 120. After the dispensed or extruded elastomer, polymer or plastic cures, partially or completely, in situ (e.g., becomes cross-linked), the removable mold, removable female mold, removable frame or removable skeleton is removed to reveal the gasket 120 with the desired shape, size and cross section to seal the portions of the electronic assembly and to provide a path for the flow or routing of possible fluid (e.g., leakage or leaking fluid in the channel 217 to a (collection) container or exit aperture 140 or exit port).

In certain embodiments, the cured gasket 120 has pedestals (167, 169 in FIG. 10) or vias between different layers of the electronic assembly to hold or retain the gasket 120 in place with respect to the electronic assembly (211, 311). When the gasket 120 is formed by dispensing uncured elastomer, polymer or plastic as bead or extruded material, the dispensed material can flow into the voids or vias in the housing, layers, circuit boards (44, 144), or portions of the electronic assembly (211, 311). After the elastomer, polymer or plastic is cured within the via or pedestal, the cured elastomer, polymer or plastic bead or extruded material that forms that gasket 120 is held in place, secured or retained (e.g., mechanically) by the vias or pedestals.

In an alternate embodiment, the gasket 120 is adhesively bonded to the housing, layers, circuit boards, or other portions of the electronic assembly to hold, secure, or retain the gasket 120.

Figure 10:
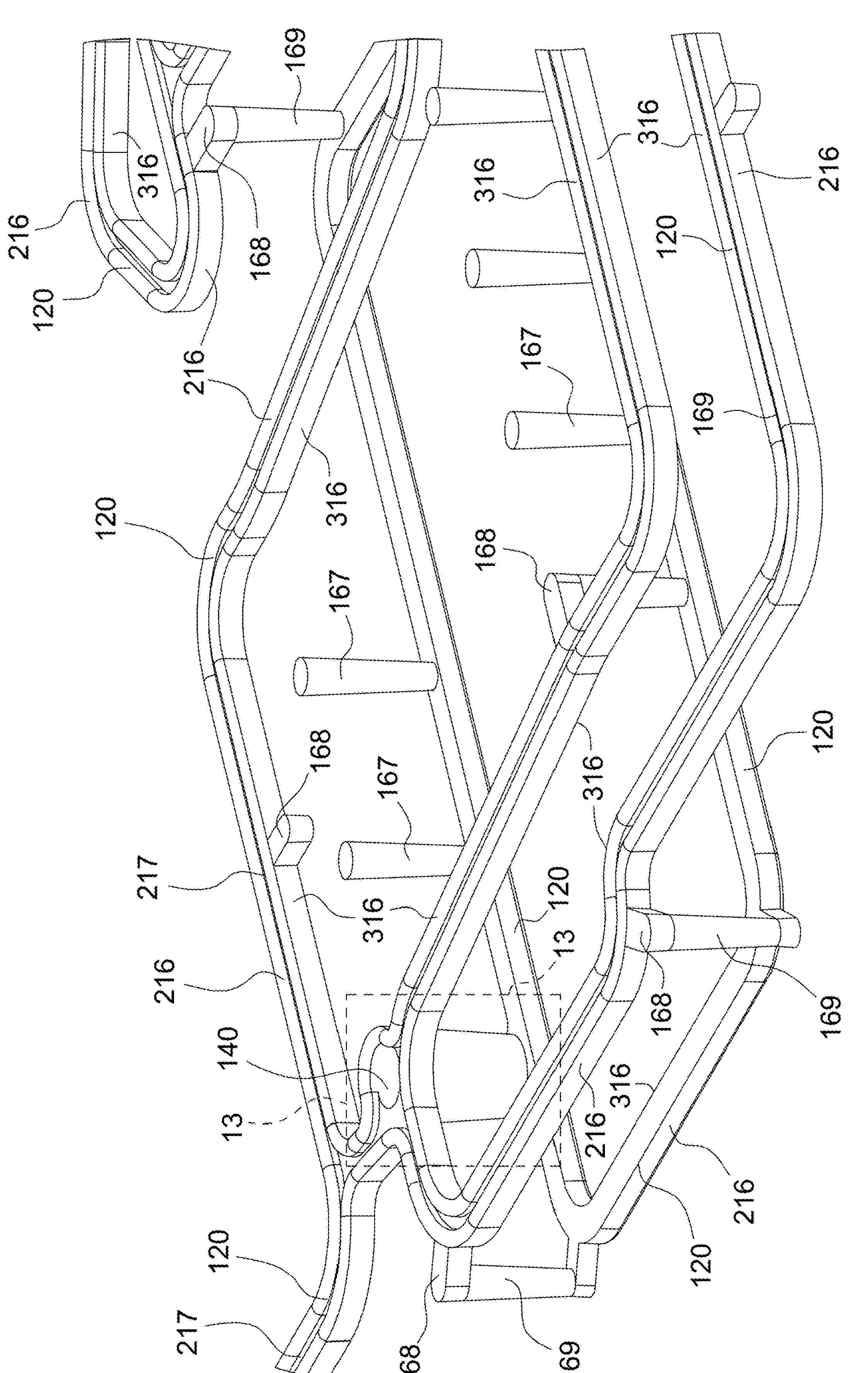
FIG. 10 shows an enlarged rectangular region (10) of the plan view of FIG. 9 of the gasket.

FIG. 10 shows an enlarged rectangular region (10) of the plan view of FIG. 9 of the gasket. Like reference numbers in FIG. 9 and FIG. 10 indicate like features, elements or structures. The gasket 120 further comprises additional features for retaining the gasket 120 with respect to one or more portions or surfaces of the electronic assembly as follows: (a) transverse projections 168, such as nubs, where the projections 168 may engage a groove, recess or channel in a portion of the electronic assembly, and (b) pedestals (167, 169) that may engage a via or vertical opening in a portion of the electronic assembly. Some pedestals 169 may be attached, connected to or adhesively bonded to projections 168 on both ends to retain, hold or lock the gasket 120 in place with respect to the electronic assembly (211, 311), its housing (102,104), or portions of the electronic assembly (211, 311).

Figure 11:
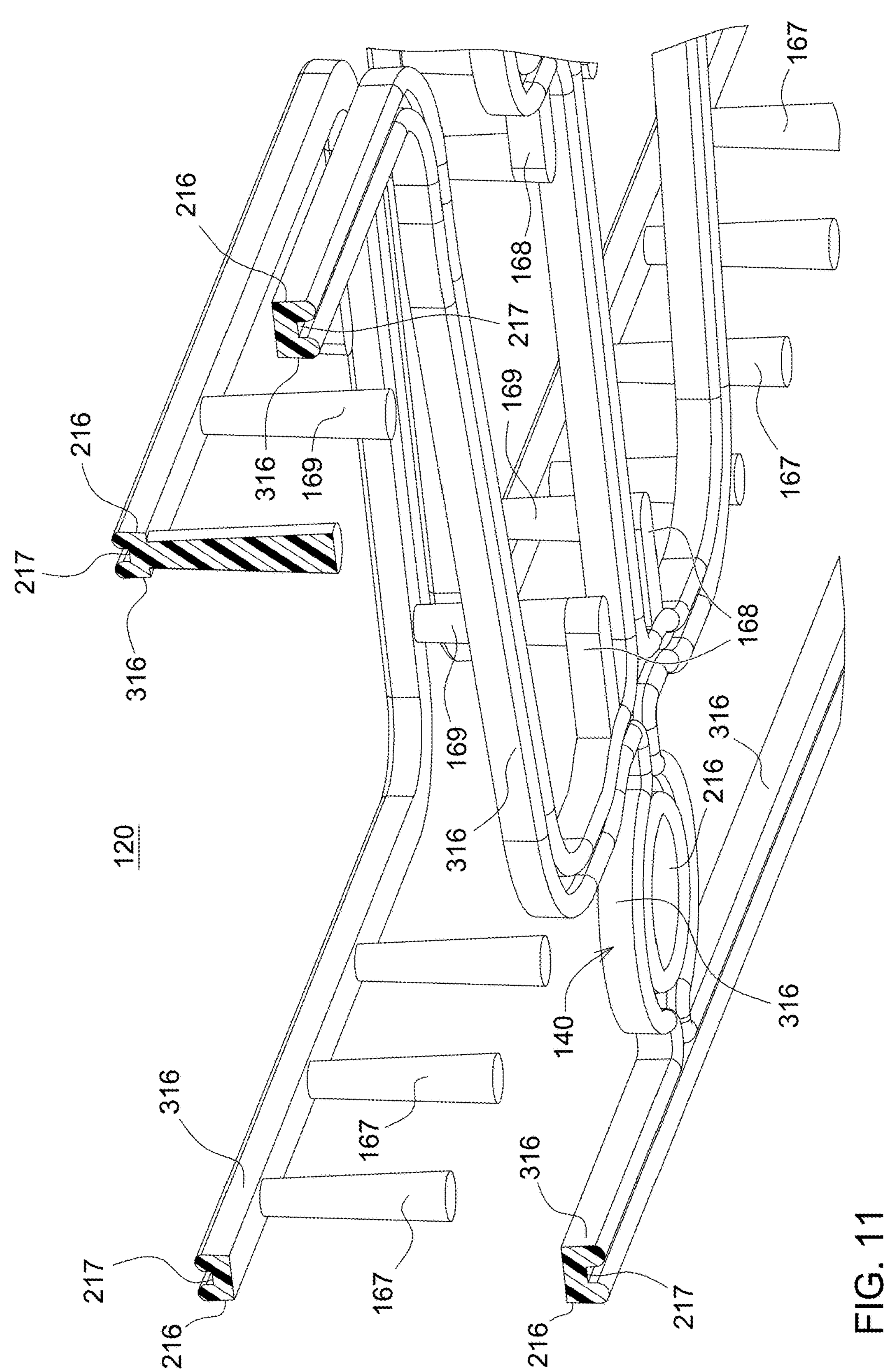
FIG. 11 shows an enlarged rectangular region (11) of the plan view of FIG. 9 of the gasket.

FIG. 11 shows an enlarged rectangular region (11) of the plan view of FIG. 9 of the gasket 120. Like reference numbers in FIG. 9 through FIG. 13, inclusive, indicate like features, elements or structures.

Figure 12:
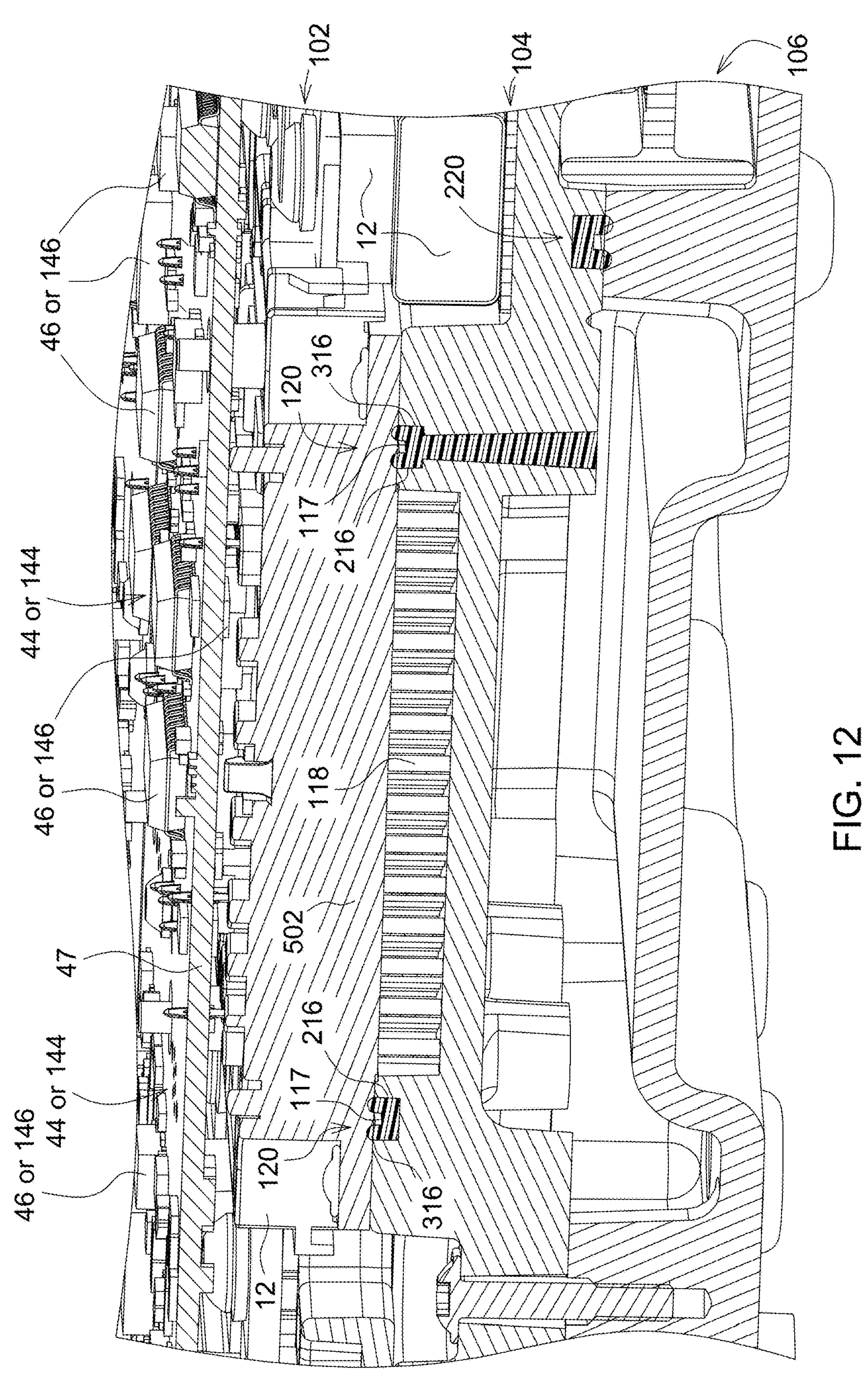
FIG. 12 shows a cross-section of the gasket of FIG. 11 installed (or dispensed) in the electronic assembly, where the electronic assembly of FIG. 12 is cut-away to reveal a cross-section of the gasket in alignment with FIG. 11.

FIG. 12 shows a cross-section of the gasket of FIG. 11 installed (or dispensed) in the electronic assembly, where the electronic assembly of FIG. 12 is cut-away to reveal a cross-section of the gasket 120 in alignment with FIG. 11. As illustrated in FIG. 12, one or more circuit boards (44, 144) are housed in or mounted in the electronics cavity region (12,112), where each circuit board (44, 144) may be populated with electronic components (46, 146) or electrical components. Each circuit board (44, 144) may comprise a dielectric substrate with conductive circuit traces on one or both sides for mounting electronic components (46, 146). The electronic components (46, 146) may comprise heat-generating components, such as semiconductor devices, power switching transistors, electronic data processors, system-on-chips (SOC), microchips, or the like. The gasket 120, or its walls (216, 316), retain, isolate and seal coolant within coolant cavity regions 118 of the electronic assembly such that coolant may be circulated through the electronic assembly for dissipating heat or thermal energy from the heat generating electronic components (e.g., 46, 146). The gasket 120, or its walls (216, 316), retain, isolate and seal coolant within lubricant cavity regions 106 of the electronic assembly or any lubricant bath, pan, or reservoir (e.g., of a gearbox or transmission) in which the electronic assembly is installed or housed, such that the lubricant (e.g., transmission fluid or oil) may be circulated around, near, adjacent or through a portion the electronic assembly (e.g., for dissipating heat or thermal energy from the heat generating components).

Figure 13:
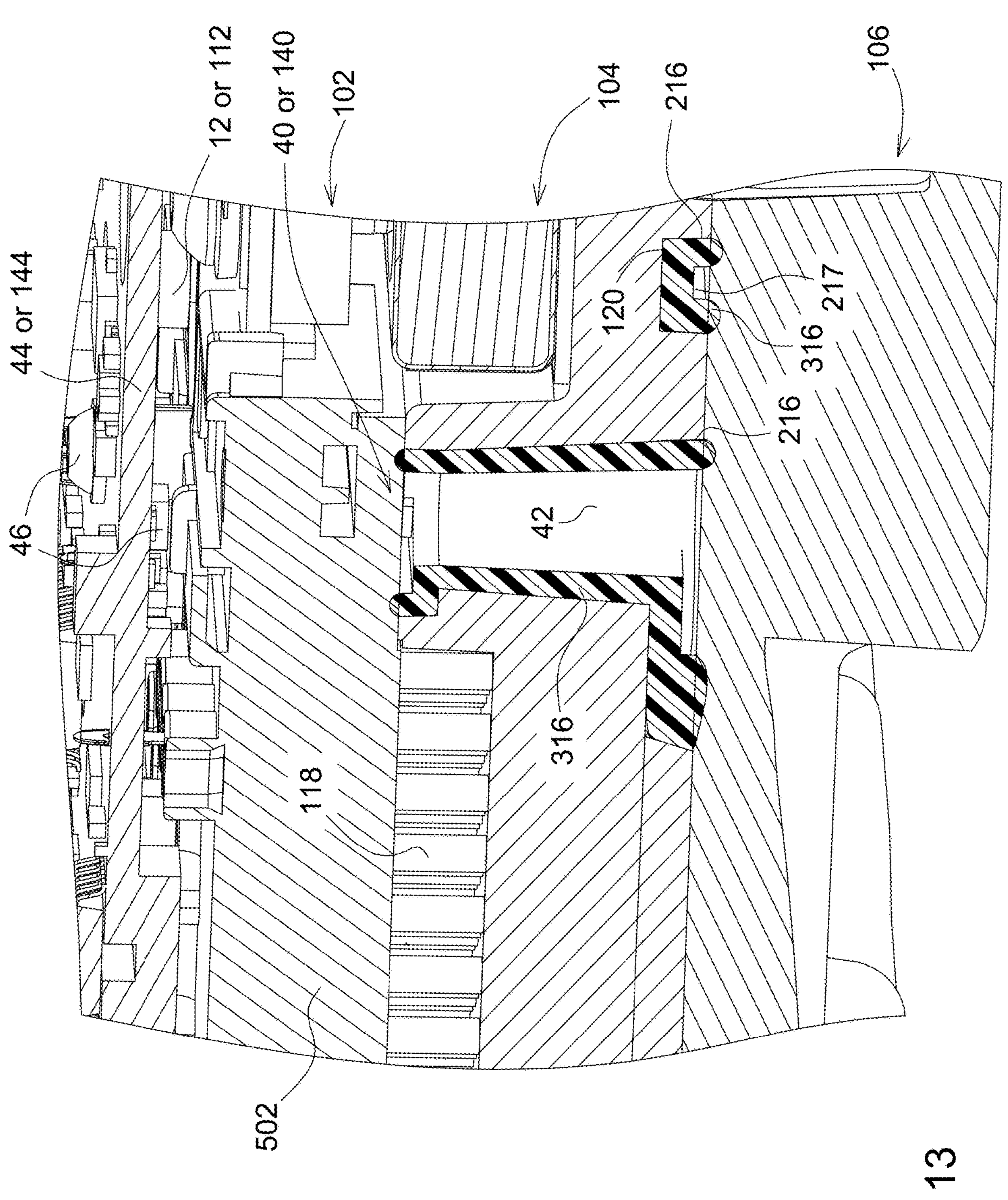
FIG. 13 shows a cross-sectional portion of the gasket of FIG. 10 in the region 13, where the gasket is installed (or dispensed) in the electronic assembly, where the electronic assembly is cut-away to reveal a perspective view of a vertical channel or drain within the gasket.

FIG. 13 shows a cross-sectional portion of the gasket 120 of FIG. 10 in the region 13, where the gasket 120 is installed (or dispensed) in the electronic assembly, where the electronic assembly is cut-away to reveal a perspective view of a vertical channel 42 or drain within the gasket 120. The coolant cavity region 118 (e.g., coolant cavity channel) is isolated or sealed at an outer wall 316 of gasket 120. If the outer wall 316 is compromised near the seam between first housing portion 104 and the second housing portion 102, the leaking coolant may track or flow within the channel 117 until it is routed to an exit aperture 140.

A first outer lip or outer lip (216, 316) of the gasket 120 may define a boundary of the electronics cavity region (12, 112); such first outer lip that faces or bounds the electronics cavity region can be referred to as an electronics-cavity-adjoining lip. A second outer lip (216, 316) or outer lip (16, 116) of the gasket 20 may define a boundary of the coolant cavity region 18; such second outer lip that faces or bounds the electronics cavity region 18 can be referred to as a coolant-cavity-adjoining lip. The first outer lip or the second outer lip (16, 116) may also face or bound a lubricant cavity region 106 to isolate the lubricant (e.g., oil or hydraulic fluid) from an electronics cavity region (12, 112), a coolant cavity region (18, 118), or both.

In one embodiment, the electronics cavity region (12, 112) is filled with air, such as air at ambient air pressure of the environment outside of the electronics assembly or its electronics cavity region (12, 112).

In an alternate embodiment, the electronics cavity region (12, 112) is filled with pressurized air or compressed air (e.g., at an air pressure above the ambient air pressure) provided by an air compressor connected to an input port in communication with the electronics cavity region and an exit port coupled to a pressure relief valve or a pressure regulator valve that vents pressurized air to the ambient environment if the pressurized air within the electronics cavity region exceeds a maximum threshold, where the maximum threshold is commensurate with a hydraulic pressure range (e.g., target design hydraulic pressure range, an average or mean hydraulic pressure and its standard deviation, or an observed hydraulic pressure range) of the coolant against, adjoining or threatening, or retained by any coolant facing wall (216, 316) of the gasket 120.

In another alternate embodiment, the electronics cavity region (12, 112) is filled with (e.g., injection molded with) a dielectric potting compound, a dielectric elastomer, a plastic encapsulation or a polymeric encapsulation to protect the electronic components from the ingress of any coolant, fluid, or lubricant that could breach or does breach the seal of the gasket.

Although certain embodiments of an electronic assembly have been described in this disclosure, the scope of the coverage of this disclosure may extend to variants of the electronic assembly, systems, methods, processes, examples, systems and concepts disclosed herein. For example, in any patent that may be granted on this disclosure, one or more claims can cover equivalents and variants to the full extent permitted under applicable law, among other things The following is claimed:

1. An electronic assembly comprising:

a first housing portion having an electronics cavity for housing a circuit board having a plurality of heat-generating electronic components, each of the plurality of heat-generating electronic components being thermally coupled to a thermal plate positioned between the respective electronic component and the circuit board;

a second housing portion having a coolant cavity or coolant channel for circulating a coolant to dissipate heat from the heat-generating electronic components; and a gasket for isolating or hermetically sealing the electronics cavity from the coolant circulating in the coolant cavity or coolant channel, wherein the gasket comprises a seal with two outer lips and a primary channel between the two outer lips, wherein the primary channel is not in fluid communication with the coolant circulating in the coolant cavity or coolant channel during normal circulation of the coolant, and wherein the primary channel is configured to convey coolant to an exit aperture within the primary channel if the coolant penetrates one of the two outer lips facing the coolant cavity to prevent the ingress of fluid into the electronics cavity.

2. The electronics assembly according to claim 1 wherein the exit aperture is disposed in one side-wall of a non-penetrated one of the lips facing the electronics cavity and wherein the exit aperture is bounded by a secondary gasket to contain the coolant.

3. The electronics assembly according to claim 2 wherein within the first housing portion or the second housing portion there is a secondary channel that is generally perpendicular to the primary channel and that serially receives coolant from the primary channel to route the received coolant away from the electronics cavity.

4. The electronics assembly according to claim 1 wherein the exit aperture is disposed within a central portion or bottom wall of the primary channel.

5. The electronic assembly according to claim 1 wherein the gasket has a generally H-shaped cross-section.

6. The electronics assembly according to claim 5 wherein the gasket has outer lips that are connected via a perpendicular bottom wall.

* * * * *